US011210004B2

(12) United States Patent
 Song

(10) Patent No.: US 11,210,004 B2
(45) Date of Patent: Dec. 28, 2021

(54) CONTROLLER MEMORY SYSTEM TO PERFORM A SINGLE LEVEL CELL (SLC), OR MULTI LEVEL CELL (MLC) OR TRIPLE LEVEL CELL (TLC) PROGRAM OPERATION ON A MEMORY BLOCK

(71) Applicant: SK hynix Inc., Gyeonggi-do (KR)

(72) Inventor: Myung Ho Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 148 days.

(21) Appl. No.: 16/591,300

(22) Filed: Oct. 2, 2019

(65) Prior Publication Data
US 2020/0310646 A1    Oct. 1, 2020

(30) Foreign Application Priority Data

Mar. 28, 2019  (KR) .................. 10-2019-0036355

(51) Int. Cl.
 *G06F 3/06*      (2006.01)
(52) U.S. Cl.
 CPC ............ *G06F 3/064* (2013.01); *G06F 3/0604* (2013.01); *G06F 3/0632* (2013.01); *G06F 3/0653* (2013.01); *G06F 3/0659* (2013.01); *G06F 3/0679* (2013.01)
(58) Field of Classification Search
 CPC .... G06F 3/0604; G06F 3/0632; G06F 3/0653; G06F 3/0659; G06F 3/0679
 See application file for complete search history.

(56) References Cited

U.S. PATENT DOCUMENTS

| 7,287,118 | B2 * | 10/2007 | Chang ................. G06F 12/0246 365/185.02 |
| 7,545,673 | B2 * | 6/2009 | Lasser ................. G11C 11/5628 365/185.03 |
| 10,824,518 | B2 * | 11/2020 | Kim ..................... G06F 11/1448 |
| 2010/0064094 | A1 * | 3/2010 | Yeh ..................... G06F 12/0246 711/103 |

FOREIGN PATENT DOCUMENTS

| KR | 10-1548175 | 8/2015 |
| KR | 10-2016-0075918 | 6/2016 |

\* cited by examiner

*Primary Examiner* — Tammara R Peyton
(74) *Attorney, Agent, or Firm* — IP & T Group LLP

(57) ABSTRACT

A controller may control a memory device including memory blocks. The controller may include a processor configured to generate a command queue in response to a write command, a wear level management block configured to check a wear level of each memory block based on an erase/program pulse count variation, and manage the memory blocks such that each memory block belong to an SLC memory block group or an MLC memory block group, and a memory device control circuit configured to control the memory device to perform a write operation in response to the command queue. The memory device control circuit may select a first memory block belong to the SLC memory block group when the write operation is an operation for important data, and select a second memory block belong to the MLC memory block group when the write operation is an operation for normal data.

16 Claims, 10 Drawing Sheets

CONTROLLER MEMORY SYSTEM TO PERFORM A SINGLE LEVEL CELL (SLC), OR MULTI LEVEL CELL (MLC) OR TRIPLE LEVEL CELL (TLC) PROGRAM OPERATION ON A MEMORY BLOCK

CROSS-REFERENCE TO RELATED APPLICATION

The present application claims priority under 35 U.S.C. § 119(a) to Korean patent application number 10-2019-0036355, filed on Mar. 28, 2019, which is incorporated herein by reference in its entirety.

BACKGROUND

Field of Invention

The Various embodiments of the present disclosure generally relate to an electronic device, and more particularly, to a controller, a memory system including the controller, and a method of operating the memory system.

Description of Related Art

Recently, the paradigm for the computer environment has been converted into ubiquitous computing so that computer systems can be used anytime and anywhere. As a result, use of portable electronic devices such as mobile phones, digital cameras, and notebook computers has rapidly increased. Generally, portable electronic devices use a memory system which employs a memory device for storing data, i.e., as a data storage device. The memory device may be used as a main memory device or an auxiliary memory device of the portable electronic devices.

Memory devices provide substantial advantages over non-semiconductor based data storage devices because they do not have any mechanical driving parts, and, hence, provide improved stability and durability, increased information access speed, and reduced power consumption. Examples of memory systems having such advantages, may include a universal serial bus (USB) memory device, a memory card having various interfaces, a solid state drive (SSD), and so forth.

Memory devices are classified into volatile memory devices and nonvolatile memory devices.

A nonvolatile memory device, although having comparatively low read and write speeds, may retain data stored therein even when a power supply is interrupted. Therefore, the nonvolatile memory device is used when there is a need for storing data which is required to be retained regardless of whether or not it is connected to a power supply. Representative examples of the nonvolatile memory device may include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). The flash memory is classified into a NOR type memory and a NAND type memory.

SUMMARY

Various embodiments of the present disclosure are directed to a controller, a memory system including the controller, and a method of operating the memory system.

The controller and memory system may manage the memory blocks of a memory device of the memory system by determining a wear level of each memory block based on a variation in an erase/program pulse count value of the memory block.

According to an embodiment of the present disclosure a controller is provided configured to control a memory device including a plurality of memory blocks. The controller may include a processor configured to generate a command queue in response to a write command received from a host. The controller may also include a wear level management block configured to check a wear level of each of the plurality of memory blocks based on an erase/program pulse count variation of the corresponding memory block, and manage the plurality of memory blocks such that each of the plurality of memory blocks belong to a single-level-cell memory block group or a multi-level-cell memory block group based on a result of the checking of the wear level of the corresponding memory block. The controller may also include a memory device control circuit configured to control the memory device to perform a write operation corresponding to the write command in response to the command queue, wherein the memory device control circuit selects a first memory block belong to the single-level-cell memory block group among the plurality of memory blocks when the write operation is a write operation for important data, and selects a second memory block belong to the multi-level-cell memory block group when the write operation is a write operation for normal data.

According to another embodiment of the present disclosure a memory system may include a memory device including a plurality of memory blocks, and configured to perform a write operation on the plurality of memory blocks. The memory system may also include controller configured to check an erase/program pulse count variation of each of memory blocks having a free block status among the plurality of memory blocks during a wear level check operation; manage the memory blocks having the free block status such that each of the memory blocks having the free block status belongs to a single-level-cell block group or a multi-level-cell block group based on the checked erase/program pulse count variation, and control the write operation in response to a write command received from a host such that a first memory block belonging to the single-level-cell block group among the plurality of memory blocks is selected when the write command corresponds to the write operation for important data, and a second memory block belonging to the multi-level-cell block group among the plurality of memory blocks is selected when the write command corresponds to the write operation for normal data.

According to yet another embodiment of the present disclosure a method of operating a memory system is provided, the method including: checking a wear level of each of memory blocks based on an erase write (EW) cycling count and an erase/program pulse count variation of the corresponding memory block; managing the memory blocks by classifying the memory blocks into a single-level-cell block group and a multi-level-cell block group based on the wear levels of the memory blocks; determining, when a write command and write data are received from a host, whether the write data is important data or normal data; selecting a first memory block belonging to the single-level-cell block group when the write data is determined to be the important data, and performing a write operation on the first memory block; and selecting a second memory block belonging to the multi-level-cell block group when the data is determined to be normal data, and performing the write operation on the second memory block.

In an embodiment of the present disclosure a controller is provided which is configured to control a memory device including a plurality of memory blocks. The controller may include: a processor configured to generate a command queue in response to a write command received from a host and a wear level management block configured to check, during a wear level check operation, a wear level of each of the memory blocks based on an erase write (EW) cycling count of the corresponding memory block, and calculate a final wear level of each of the memory blocks by weighting to the wear level of the corresponding memory block. The controller may also include a memory device control circuit configured to select a memory block having a lowest final wear level, and control a write operation of the selected memory block in response to the command queue.

According to yet another embodiment of the present disclosure an operating method of a controller for controlling a memory device having free blocks, the operating method including: controlling the memory device to perform a program operation to a target block as a single level block among the free blocks when the target block has a threshold or greater erase/program pulse count variation; and controlling the memory device to perform a program operation to the target block as a multi-level block when the target block has an erase/program pulse count variation less than the threshold, wherein the erase/program pulse count variation of the target block is difference between a current erase/program pulse count and an initial erase/program pulse count of the target block.

These and other advantages and features of the present invention will become better understood from the following description of specific embodiments in conjunction with the following drawings.

DETAILED DESCRIPTION

Figure 1:
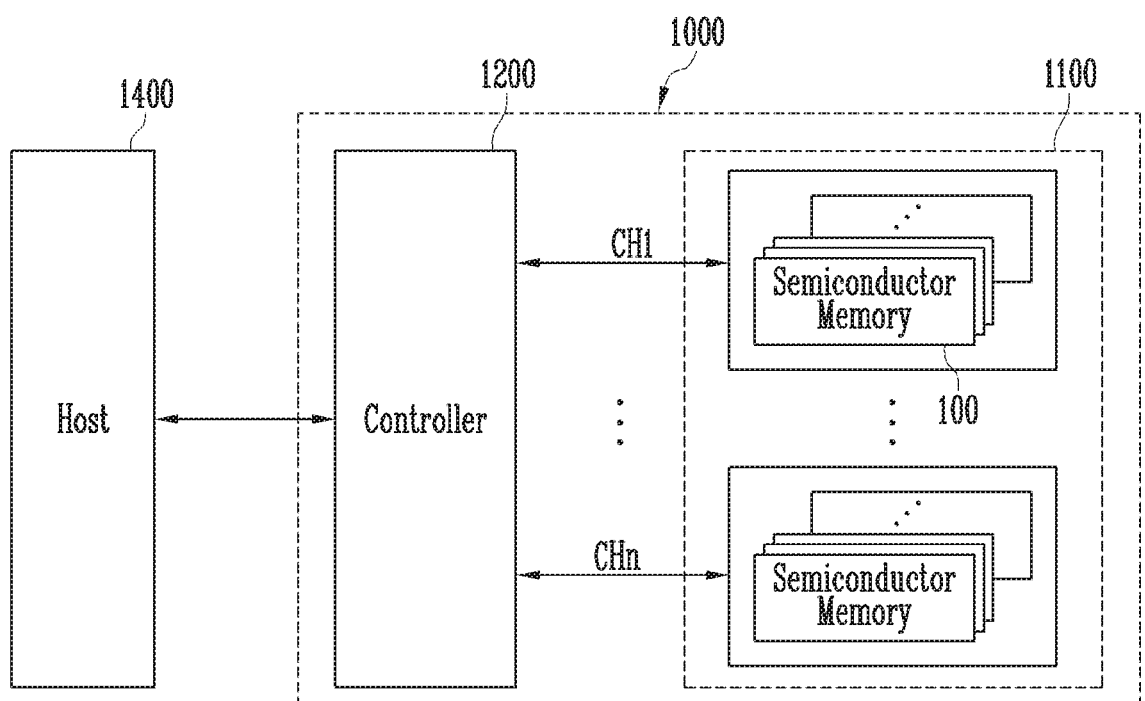
FIG. 1 is a block diagram illustrating a memory system in accordance with an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will now be described in detail based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, it is to be understood that the present description is not intended to limit the present disclosure to those exemplary embodiments, and the present disclosure is intended to cover not only the exemplary embodiments, but also various alternatives, modifications, equivalents and other embodiments that fall within the spirit and scope of the present disclosure.

It will be understood that, although the terms "first", "second", etc. may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art, and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described more fully hereinafter with reference to the accompanying drawings, in which preferred embodiments of the present disclosure are shown, so that those of ordinary skill in the art can easily carry out the technical idea of the present disclosure.

FIG. 1 is a block diagram illustrating a memory system 1000 in accordance with an embodiment of the present disclosure.

Referring to FIG. 1, the memory system 1000 may include a memory device 1100 and a controller 1200. The memory system 1000 may be communicating with a host 1400. The memory device 1100 may include a plurality of semiconductor memories 100. The plurality of semiconductor memories 100 may be divided into a plurality of groups. Although in the present embodiment the host 1400 has been illustrated as being external to the memory system 1000, it is noted that in other embodiments the memory system 1000 may be included as a component of the host 1400. only the controller 1200 and the memory device 1100, and the host 1400 may be disposed outside the memory system 1000.

In FIG. 1, the plurality of groups of the memory device 1100 may communicate with the controller 1200 through first to n-th channels CH1 to CHn, respectively. Each semiconductor memory 100 will be described below with reference to FIG. 4.

Each of the plurality of groups of semiconductor memories 100 may communicate with the controller 1200 through one common channel. The controller 1200 may control the plurality of semiconductor memories 100 of the memory device 1100 through the plurality of channels CH1 to CHn.

The controller 1200 is coupled between the host 1400 and the memory device 1100. The controller 1200 may access the memory device 1100 in response to a request from the host 1400. For example, the controller 1200 may control a read operation, a write operation, an erase operation, or a background operation of the memory device 1100 in response to a host command received from the host 1400. During a write operation, the host 1400 may transmit data and an address along with a host command. During a read operation, the host 1400 may transmit an address along with a host command. The controller 1200 may provide an interface between the memory device 1100 and the host 1400. The controller 1200 may run firmware for controlling the memory device 1100.

The controller 1200 may check the wear level of the memory device 1100 periodically or in response to a request of the host 1400, and perform a wear leveling operation based on the checked wear level. During a wear level check operation, the controller 1200 may check erase/program pulse count variations of memory blocks included in the memory device 1100, and determine the wear level of each memory block based on the corresponding erase/program pulse count variation. The controller 1200 may control a memory block having a wear level within a setting range among the memory blocks which belongs to a single-level cell (SLC) block pool and control a program operation using a single-level cell mode to be performed to the memory block belonging to a single-level cell (SLC) block pool. Furthermore, the controller 1200 may control a remaining memory block having a wear level out of the setting range which belongs to a multi-level cell block pool and control a program operation using a multi-level cell (MLC) mode or a triple-level cell (TLC) mode to be performed to the memory block belonging to a multi-level cell block pool.

In an embodiment, during a wear level check operation, the controller 1200 may check erase/program pulse count variations of memory blocks included in the memory device 1100, determine the wear level of each memory block based on the corresponding erase/program pulse count variation, and control the memory block selected during an overall operation based on the determined wear level. For example, during a write operation, a memory block having a comparatively low wear level is preferentially selected so that the write operation is performed on the selected memory block.

The host 1400 may include a portable electronic device such as a computer, a personal digital assistant (PDA), a portable multimedia player (PMP), an MP3 player, a camera, a camcorder, or a mobile phone. The host 1400 may use a host command to make a request for a write operation, a read operation, an erase operation, etc. of the memory system 1000. The host 1400 may transmit, to the controller 1200, data, an address, and a host command corresponding to a write command, to perform a write operation of the memory device 1100, and may transmit an address and a host command corresponding to a read command to the controller 1200 to perform a read operation. Here, addresses may be logical addresses.

The controller 1200 and the memory device 1100 may be integrated into a single semiconductor device. In an embodiment, the controller 1200 and the memory device 1100 may be integrated into a single semiconductor device to form a memory card. For example, the controller 1200 and the memory device 1100 may be integrated into a single semiconductor device and form a memory card such as a personal computer memory card international association (PCM-CIA), a compact flash card (CF), a smart media card (SM or SMC), a memory stick multimedia card (MMC, RS-MMC, or MMCmicro), a SD card (SD, miniSD, microSD, or SDHC), or a universal flash storage (UFS).

The controller 1200 and the memory device 1100 may be integrated into a single semiconductor device to form a solid state drive (SSD). The SSD may include a storage device configured to store data in a semiconductor memory 100.

In an embodiment, the memory system 1000 may be provided as one of various elements of an electronic device such as a computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the memory device 1100 or the memory system 1000 may be embedded in various types of packages. For example, the memory device 1100 or the memory system 1000 may be packaged in a package type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 2:
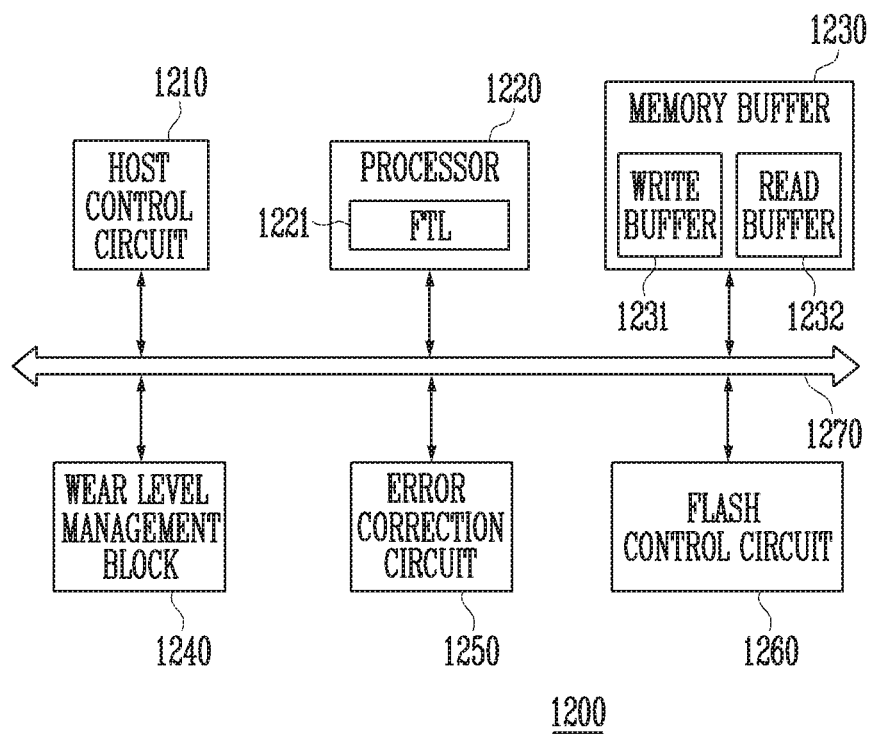
FIG. 2 is a block diagram illustrating a configuration of a controller of FIG. 1 in accordance with an embodiment of the present disclosure.

FIG. 2 is a diagram illustrating a configuration of the controller 1200 of FIG. 1, in accordance with an embodiment of the present disclosure.

Referring to FIG. 2, the controller 1200 may include a host control circuit 1210, a processor 1220, a memory buffer 1230, a wear level management block 1240, an error correction code (ECC) circuit 1250, a flash control circuit 1260, and a bus 1270.

The bus 1270 may provide a channel between the components of the controller 1200.

The host control circuit 1210 may control data transmission between the host 1400 of FIG. 1 and the memory buffer 1230. In an embodiment, the host control circuit 1210 may control an operation of buffering data input from the host 1400 to the memory buffer 1230. In an embodiment, the host control circuit 1210 may control an operation of outputting data buffered in the memory buffer 1230 to the host 1400. The host control circuit 1210 may include a host interface.

The processor 1220 may control the overall operation of the controller 1200 and perform a logical operation. The processor 1220 may communicate with the host 1400 of FIG. 1 through the host control circuit 1210, and communicate with the memory device 1100 of FIG. 1 through the flash control circuit 1260. The processor 1220 may control the operation of the memory system 1000 by using the memory buffer 1230 as an operation memory, a cache memory, or a buffer memory. Furthermore, the processor 1220 may control the memory buffer 1230. The processor 1220 may rearrange, based on priorities, a plurality of commands received from the host 1400 and generate a command queue, and may control the flash control circuit 1260 based on the command queue. The processor 1220 may parse the host command and determine whether data received along with the host command are normal data or important data (enhanced data). The important data may be system data.

The processor 1220 may include a flash translation layer (hereinafter, referred to as "FTL") 1221.

The FTL 1221 may drive firmware stored in the memory buffer 1230. During a data write operation, the FTL 1221 may map a physical address, corresponding to a logical address input from the host 1400 of FIG. 1, to the logical address. Also, during a data read operation, the FTL 1221 may check a physical address mapped to a logical address input from the host 1400.

The memory buffer 1230 may be used as a working memory, a cache memory, or a buffer memory of the processor 1220. The memory buffer 1230 may store codes and commands to be executed by the processor 1220. The memory buffer 1230 may store data to be processed by the processor 1220.

The memory buffer 1230 may include a write buffer 1231 and a read buffer 1232. The write buffer 1231 may temporarily store data received along with the write command from the host 1400, and then transmit the temporarily stored data to the memory device 1100 when the write command is transmitted to the memory device 1100. During a read operation, the read buffer 1232 may temporarily store data received from the memory device 1100, and then transmit the temporarily stored data to the host 1400.

The memory buffer 1230 may include a static RAM (SRAM) or a dynamic RAM (DRAM).

The wear level management block 1240 may manage the wear levels of the plurality of memory blocks included in the memory device (1100 of FIG. 1), and control each of the plurality of memory blocks to belong to the SLC block pool or the MLC/TLC block pool based on the wear levels. The SLC block pool may manage a list of memory blocks to be programmed in an SLC program mode during a program operation. The MLC/TLC block pool may manage a list of memory blocks to be programmed in a MLC program mode and memory blocks to be programmed in a TLC program mode during a program mode. The SLC program mode may be used to store important data such as system data. The MLC/TLC program mode may be used to store normal data.

In an embodiment, the wear level management block 1240 may manage the wear levels of the plurality of memory blocks included in the memory device (1100 of FIG. 1), and control a memory block selected during an overall operation of the memory device 1100 based on the wear levels. For example, the wear level management block 1240 may control the memory device 1100 to preferentially select a memory block having a comparatively low wear level during a program operation of the memory device 1100.

The ECC circuit 1250 may perform error correction. The ECC circuit 1250 may perform ECC (error correction code) encoding based on data to be written to the memory device 1100 of FIG. 1 through the flash control circuit 1260. ECC encoded data may be transmitted to the memory device 1100 through the flash control circuit 1260. The ECC circuit 1250 may perform ECC decoding for data received from the memory device 1100 through the flash control circuit 1260. For example, the ECC circuit 1250 may be included in the flash control circuit 1260 as a component of the flash control circuit 1260.

The flash control circuit 1260 may generate and output an internal command for controlling the memory device 1100 in response to a command queue generated from the processor 1220. During a data write operation, the flash control circuit 1260 may control an operation of transmitting and writing data buffered in the write buffer 1231 of the memory buffer 1230 to the memory device 1100. In an embodiment, during a read operation, the flash control circuit 1260 may control an operation of buffering, in the memory buffer 1230, data read from the memory device 1100 in response to a command queue. The flash control circuit 1260 may include a flash interface.

Figure 3:
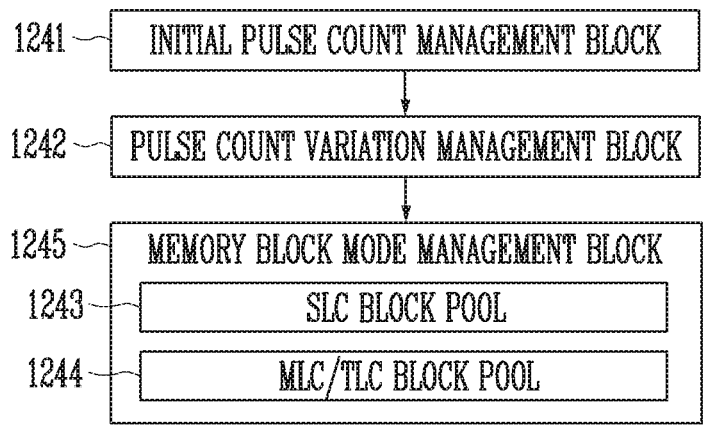
FIG. 3 is a block diagram describing a wear level management block of FIG. 2 in accordance with an embodiment of the present disclosure.

FIG. 3 is a block diagram describing a wear level management block 1240 of FIG. 2 in accordance with an embodiment of the present disclosure.

Referring to FIG. 3, the wear level management block 1240 may include an initial pulse count management block 1241, a pulse count variation management block 1242, and a memory block mode management block 1245.

The initial pulse count management block 1241 may check and store an initial erase/program pulse count for each of the plurality of memory blocks included in the memory device (1100 of FIG. 1). For example, the initial pulse count management block 1241 may control a memory device to perform a test program operation in an SLC program mode on each the plurality of memory blocks included in the memory device 1100 in an initial status immediately after completion of fabrication of the memory system 1000, and may check the number of program pulses used during a test program operation of each memory block, and store the checked number as an initial program pulse count of each memory block. The initial pulse count management block 1241 may control the memory device to perform a test erase operation on each of the plurality of memory blocks after the test program operation, and may check the number of erase pulses used during the test erase operation of each memory block and store the checked number as an initial erase pulse count of each memory block.

Furthermore, the initial pulse count management block 1241 may count and store an erase write (EW) cycling count for each of the plurality of memory blocks during an operation of the memory device 1100.

During a wear level check operation, the pulse count variation management block 1242 may check a current erase/program pulse count of each of the memory blocks having the EW cycling count equal to or greater than a preset count, and calculate an erase/program pulse count variation by comparing the checked current erase/program pulse count with the initial erase/program pulse count stored in the initial pulse count management block 1241. For example, during the wear level check operation, the pulse count variation management block 1242 may check the EW cycling count of free blocks having no valid data among the plurality of memory blocks, and select free blocks each having an EW cycling count equal to or greater than the preset count. Furthermore, the pulse count variation management block 1242 may control the memory device to perform a test program operation and a test erase operation on the selected free blocks, thus checking the current erase/program pulse count on each of the selected free blocks. The test program operation may be performed in an SLC program mode.

The pulse count variation management block 1242 may calculate an erase/program pulse count variation of each of the selected free blocks by comparing the checked current erase/program pulse count with the initial erase/program pulse count stored in the initial pulse count management block 1241.

The memory block mode management block 1245 may include an SLC block pool 1243 and an MLC/TLC block pool 1244.

Based on the erase/program pulse count variation of each of the free blocks calculated by the pulse count variation management block 1242, the memory block mode management block 1245 may manage the free blocks such that some free blocks each having a relatively large erase/program pulse count variation among the free blocks belong to the SLC block pool 1243, and the other free blocks belong to the MLC/TLC block pool 1244.

For example, based on the erase/program pulse count variation of each of the free blocks selected during a wear level operation, the memory block mode management block 1245 may manage the free blocks such that a selected free block having an erase/program pulse count variation within the preset range belongs to the SLC block pool 1243, and the other selected free blocks belong to the MLC/TLC block pool 1244. Here, the preset range may be changed depending on the number of memory blocks required to be programmed in the SLC program mode.

Figure 4:
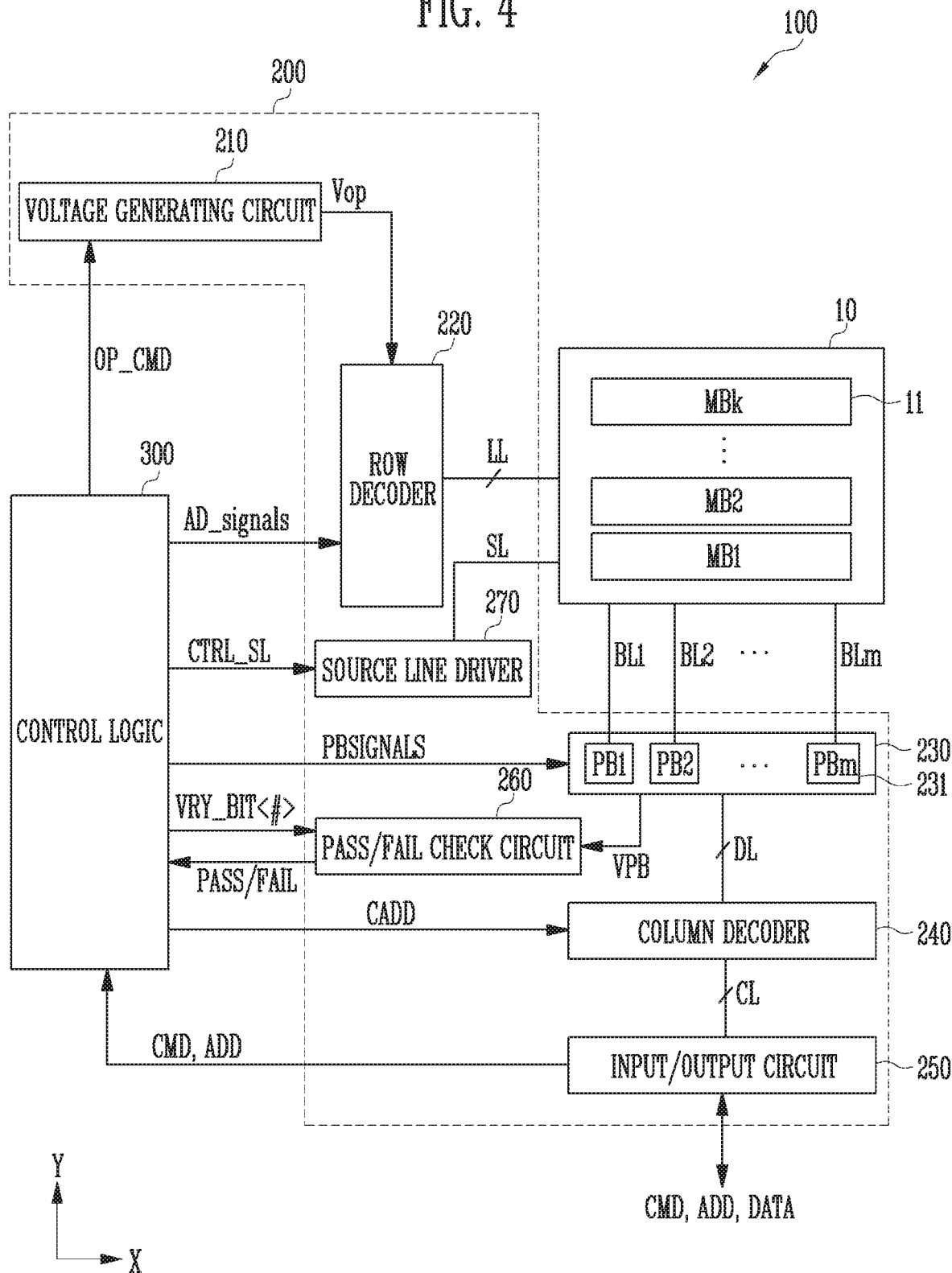
FIG. 4 is a simplified block diagram of a semiconductor memory of FIG. 1 in accordance with an embodiment of the present disclosure.

FIG. 4 is a block diagram describing the semiconductor memory 100 of FIG. 1, in accordance with an embodiment of the present disclosure.

Referring to FIG. 4, the semiconductor memory 100 may include a memory cell array 10 configured to store data. The semiconductor memory 100 may include peripheral circuits 200 configured to perform a program operation for storing data in the memory cell array 10, a read operation for outputting the stored data, and an erase operation for erasing the stored data. The semiconductor memory 100 may include a control logic 300 configured to control the peripheral circuits 200 under control of the controller (1200 of FIG. 1).

The memory cell array 10 may include a plurality of memory blocks MB1 to MBk (11), where k is a positive integer. Local lines LL and bit lines BL1 to BLm, where m is a positive integer, may be coupled to each of the memory blocks MB1 to MBk (11). For example, the local lines LL may include a first select line, a second select line, and a plurality of word lines arranged between the first and the second select lines. The local lines LL may include dummy lines arranged between the first select line and the word lines, and between the second select line and the word lines. Here, the first select line may be a source select line, and the second select line may be a drain select line. For example, the local lines LL may include word lines, drain and source select lines, and source lines SL. For example, the local lines LL may further include dummy lines. For example, the local lines LL may further include pipelines. The local lines LL may be coupled to each of the memory blocks MB1 to MBk (11). The bit lines BL1 to BLm may be coupled in common to the memory blocks MB1 to MBk (11). The memory blocks MB1 to MBk (11) may be embodied in a two- or three-dimensional structure. For example, in the memory blocks 11 having a two-dimensional structure, the memory cells may be arranged in a direction parallel to a substrate. For instance, in the memory blocks 11 having a three-dimensional structure, the memory cells may be stacked in a direction perpendicular to the substrate.

According to a program mode, the memory blocks 11 may be programmed in the SLC program mode or the MLC/TLC mode.

The peripheral circuits 200 may perform a program operation, a read operation, or an erase operation on a selected memory block 11 under control of the control logic 300. For instance, the peripheral circuits 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop to be used for a program operation, a read operation, and an erase operation in response to an operating signal OP_CMD. Furthermore, the voltage generating circuit 210 may selectively discharge the local lines LL in response to an operating signal OP_CMD. For example, the voltage generating circuit 210 may generate a program voltage, a verify voltage, a pass voltage, and a select transistor operating voltage under control of the control logic 300.

The row decoder 220 may transmit operating voltages Vop to local lines LL coupled to a selected memory block 11 in response to control signals AD_signals. For example, the row decoder 220 may selectively apply operating voltages (e.g., a program voltage, a verify voltage, and a pass voltage) generated from the voltage generating circuit 210 to the word lines among the local lines LL in response to row decoder control signals AD_signals.

During a program voltage applying operation, in response to the control signals AD_signals, the row decoder 220 may apply a program voltage generated by the voltage generating circuit 210 to a selected word line of the local lines LL, and apply a pass voltage generated by the voltage generating circuit 210 to the other unselected word lines. During a read operation, in response to the control signals AD_signals, the row decoder 220 may apply a read voltage generated by the voltage generating circuit 210 to a selected word line of the local lines LL, and apply a pass voltage generated by the voltage generating circuit 210 to the other unselected word lines.

The page buffer group 230 may include a plurality of page buffers PB1 to PBm (231) coupled to the bit lines BL1 to BLm, respectively. The page buffers PB1 to PBm (231) may operate in response to page buffer control signals PBSIG-NALS. For instance, the page buffers PB1 to PBm (231) may temporarily store data to be programmed during a program operation, or sense voltages or currents of the bit lines BL1 to BLm during a read or verify operation.

The column decoder 240 may transmit data between the input/output circuit 250 and the page buffer group 230 in response to a column address CADD. For example, the column decoder 240 may exchange data with the page buffers 231 through data lines DL or exchange data with the input/output circuit 250 through column lines CL.

The input/output circuit 250 may transmit an internal command CMD or an address ADD received from the controller (1200 of FIG. 1) to the control logic 300, or exchange data with the column decoder 240.

During a read operation, the pass/fail check circuit 260 may generate a reference current in response to an enable bit VRY_BIT<#>, and may compare a sensing voltage VPB received from the page buffer group 230 with a reference voltage generated by the reference current and output a pass signal PASS or a fail signal FAIL.

The source line driver 270 may be coupled, through the source line SL, to the memory cells included in the memory cell array 10, and may control a voltage to be applied to the source line SL. The source line driver 270 may receive a source line control signal CTRL_SL from the control logic 300, and control a source line voltage to be applied to the source line SL based on the source line control signal CTRL_SL.

The control logic 300 may control the peripheral circuits 200 by outputting an operating signal OP_CMD, control signals AD_signals, page buffer control signals PBSIG-NALS, and an enable bit VRY_BIT<#> in response to an internal command CMD and an address ADD. In addition, the control logic 300 may determine whether a target memory cell has passed a verification during a verify operation in response to a pass signal PASS or a fail signal FAIL.

Figure 5:
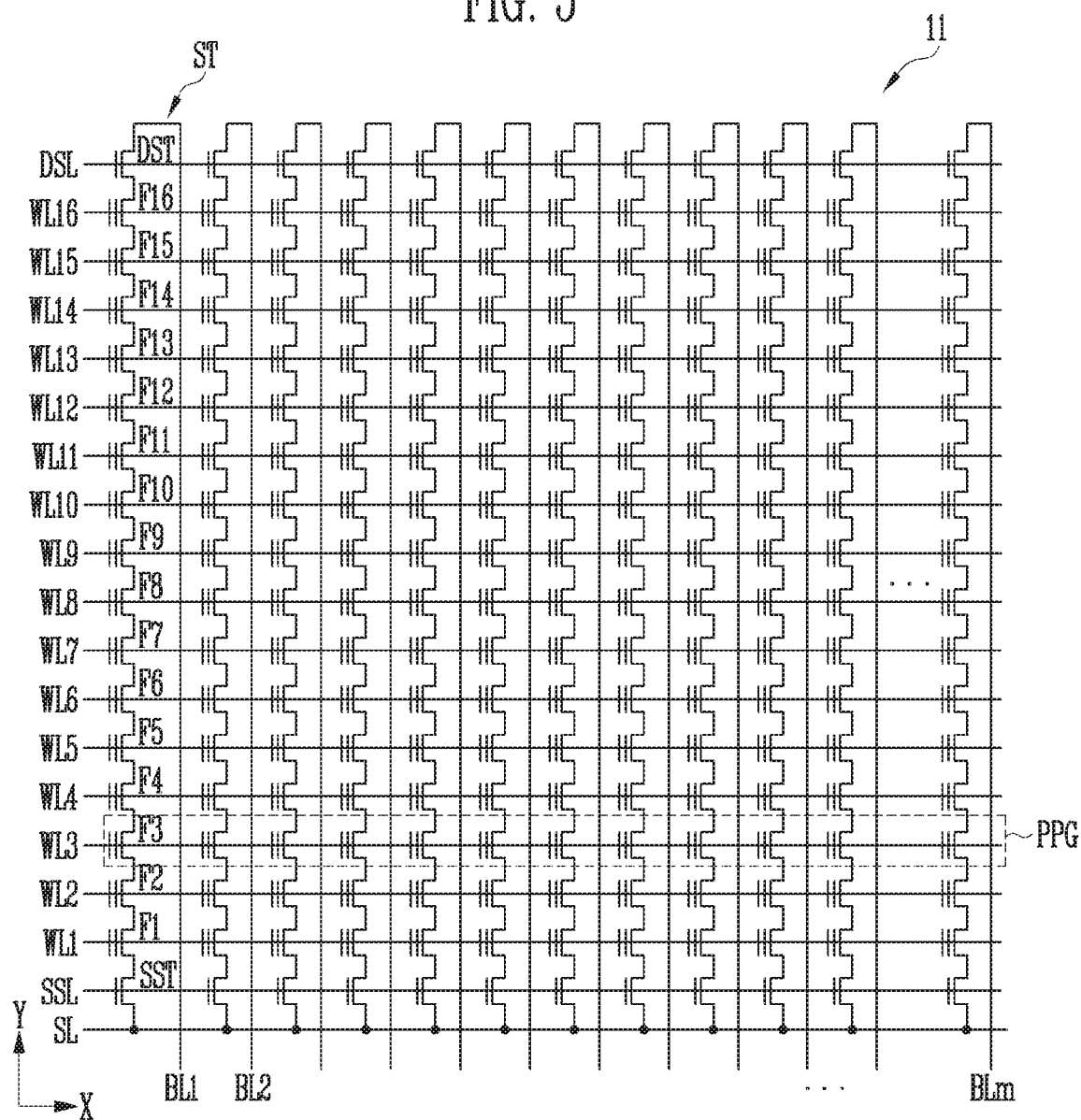
FIG. 5 is a circuit diagram illustrating a memory block of FIG. 4 in accordance with an embodiment of the present disclosure.

FIG. 5 is a circuit diagram illustrating a memory block 11 of FIG. 4 in accordance with an embodiment of the present invention.

Referring to FIG. 5, in the memory block 11, a plurality of word lines arranged parallel to each other may be coupled between a first select line and a second select line. Here, the first select line may be a source select line SSL, and the second select line may be a drain select line DSL. In more detail, the memory block 11 may include a plurality of strings ST coupled between the bit lines BL1 to BLm and the source line SL. The bit lines BL1 to BLm may be respectively coupled to the strings ST, and the source line SL may be coupled in common to the strings ST. The strings ST may have the same configuration; therefore, the string ST that is coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. At least one source select transistor SST and at least one drain select transistor DST may be included in each string ST, and a larger number of memory cells than the number of memory cells F1 to F16 shown in the drawing may be included in each string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to the plurality of word lines WL1 to WL16. Among the memory cells included in different strings ST, a group of memory cells coupled to each word line may be referred to as a physical page PPG. Therefore, the number of physical pages PPG included in the memory block 11 may correspond to the number of word lines WL1 to WL16.

Each memory cell may store 1-bit data. This memory cell is typically called a single level cell (SLC). In this case, each physical page PPG may store data for a single logical page LPG. Data of each logical page LPG may include data bits corresponding to the number of cells included in a single physical page PPG. Memory cells included in a memory block selected in the SLC program mode are programmed in a SLC manner. Each memory cell may store 2- or more-bit data. This memory cell is typically called a multi-level cell (MLC). In this case, each physical page PPG may store data of two or more logical pages LPG. Memory cells included in a memory block selected in the MLC/TLC program mode are programmed in an MLC manner.

Figure 6:
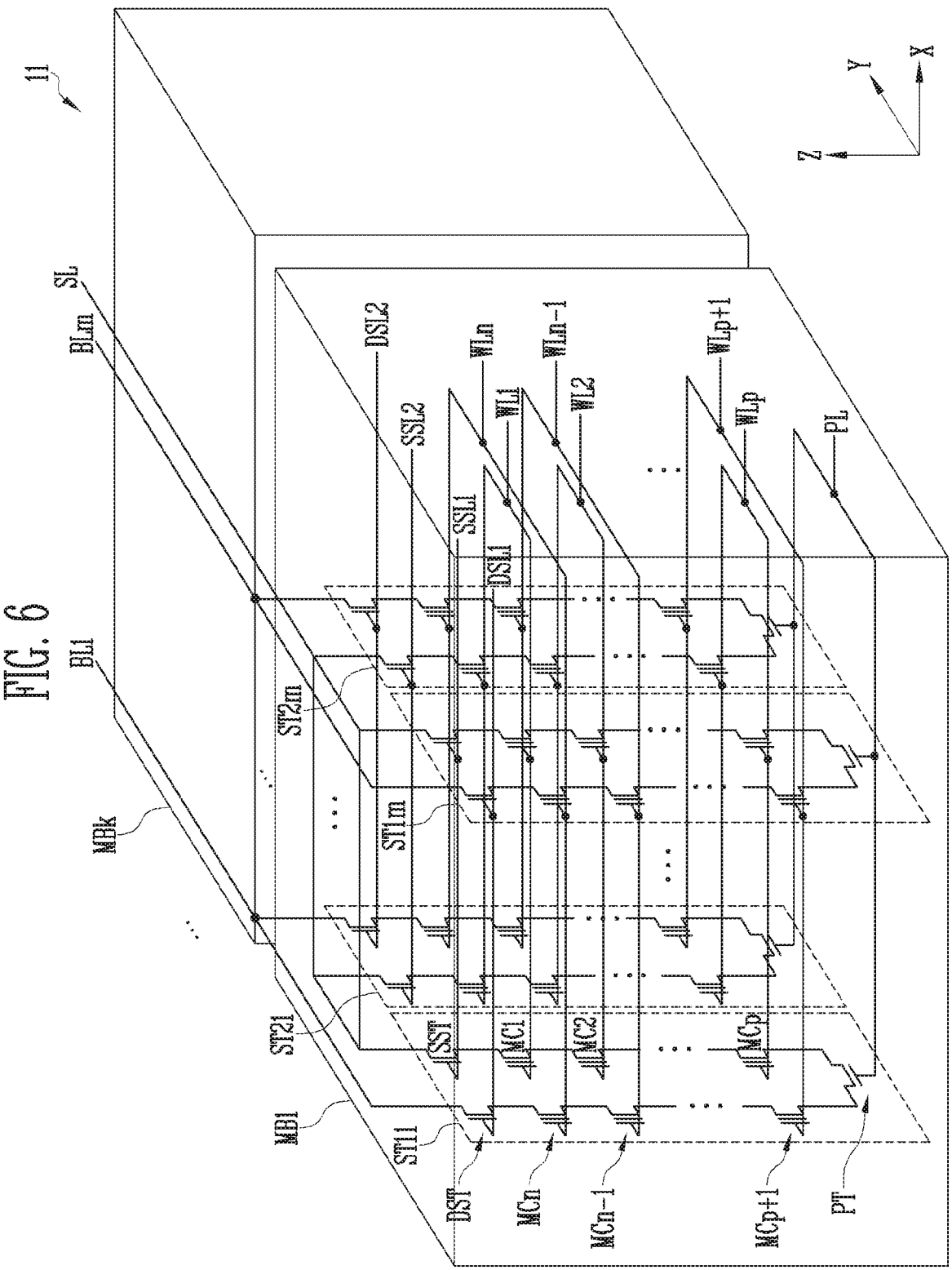
FIG. 6 is a diagram illustrating a memory block having a three-dimensional structure in accordance with an embodiment of the present disclosure.

FIG. 6 is a diagram illustrating an example of a memory block having a three-dimensional structure in accordance with an embodiment of the present disclosure.

Referring to FIG. 6, the memory cell array 10 may include a plurality of memory blocks MB1 to MBk (11). Each memory block 11 may include a plurality of strings ST11 to ST1*m* and ST21 to ST2*m*. In an embodiment, each of the strings ST11 to ST1*m* and ST21 to ST2*m* may be formed in a "U" shape. In the first memory block MB1, m strings may be arranged in a row direction (i.e. an X direction). FIG. 6 illustrates that two strings are arranged in a column direction (i.e., a Y direction), but this is only for the sake of description. For example, three or more strings may be arranged in the column direction (the Y direction).

Each of the plurality of strings ST11 to ST1*m* and ST21 to ST2*m* may include at least one source select transistor SST, first to n-th memory cells MC1 to MCn, a pipe transistor PT, and at least one drain select transistor DST.

The source select transistor SST, the drain select transistor DST, and the memory cells MC1 to MCn may have structures similar to each other. For example, each of the source select transistor SST, the drain select transistor DST, and the memory cells MC1 to MCn may include a channel layer, a tunnel insulating layer, a charge trap layer, and a blocking insulating layer. For example, a pillar for providing the channel layer may be provided in each string. For instance, a pillar for providing at least one of the channel layer, the tunnel insulating layer, the charge trap layer, and the blocking insulating layer may be provided in each string.

The source select transistor SST of each string may be coupled between the source line SL and the memory cells MC1 to MCn.

In an embodiment, source select transistors of strings arranged in the same row may be coupled to a source select line extending in the row direction. Source select transistors of strings arranged in different rows may be coupled to different source select lines. In FIG. 6, source select transistors of the strings ST11 to ST1m in a first row may be coupled to a first source select line SSL1. Source select transistors of the strings ST21 to ST2m in a second row may be coupled to a second source select line SSL2.

In an embodiment, the source select transistors of the strings ST11 to ST1m and ST21 to ST2m may be coupled in common to a single source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be successively arranged in a vertical direction (i.e., in a Z direction) and coupled in series to each other between the source select transistor SST and the pipe transistor PT. The p+1-th to n-th memory cells MCCp+1 to MCn may be successively arranged in the vertical direction (the Z direction) and coupled in series to each other between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn of each string may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or the current of the corresponding string may be stably controlled. Gates of the pipe transistors PT of the respective strings may be coupled to a pipeline PL.

The drain select transistor DST of each string may be coupled between the corresponding bit line and the memory cells MCp+1 to MCn. Strings arranged in the row direction may be coupled to corresponding drain select lines extending in the row direction. The drain select transistors of the strings ST11 to ST1m in the first row ay be coupled to a first drain select line DSL1. The drain select transistors of the strings ST21 to ST2m in the second row may be coupled to a second drain select line DSL2.

Strings arranged in the column direction may be coupled to corresponding bit lines extending in the column direction. In FIG. 6, the strings ST11 and ST21 in a first column may be coupled to a first bit line BL1. The strings ST1m and ST2m in an m-th column may be coupled to an m-th bit line BLm.

Among the strings arranged in the row direction, memory cells coupled to the same word line may form one page. For example, memory cells coupled to the first word line WL1 in the strings ST11 to ST1m of the first row may form a single page. Memory cells coupled to the first word line WL1 in the strings ST21 to ST2m of the second row may form another single page. When any one of the drain select lines DSL1 and DSL2 is selected, strings arranged in the corresponding row may be selected. When any one of the word lines WL1 to WLn is selected, a corresponding single page may be selected from the selected strings.

Figure 7:
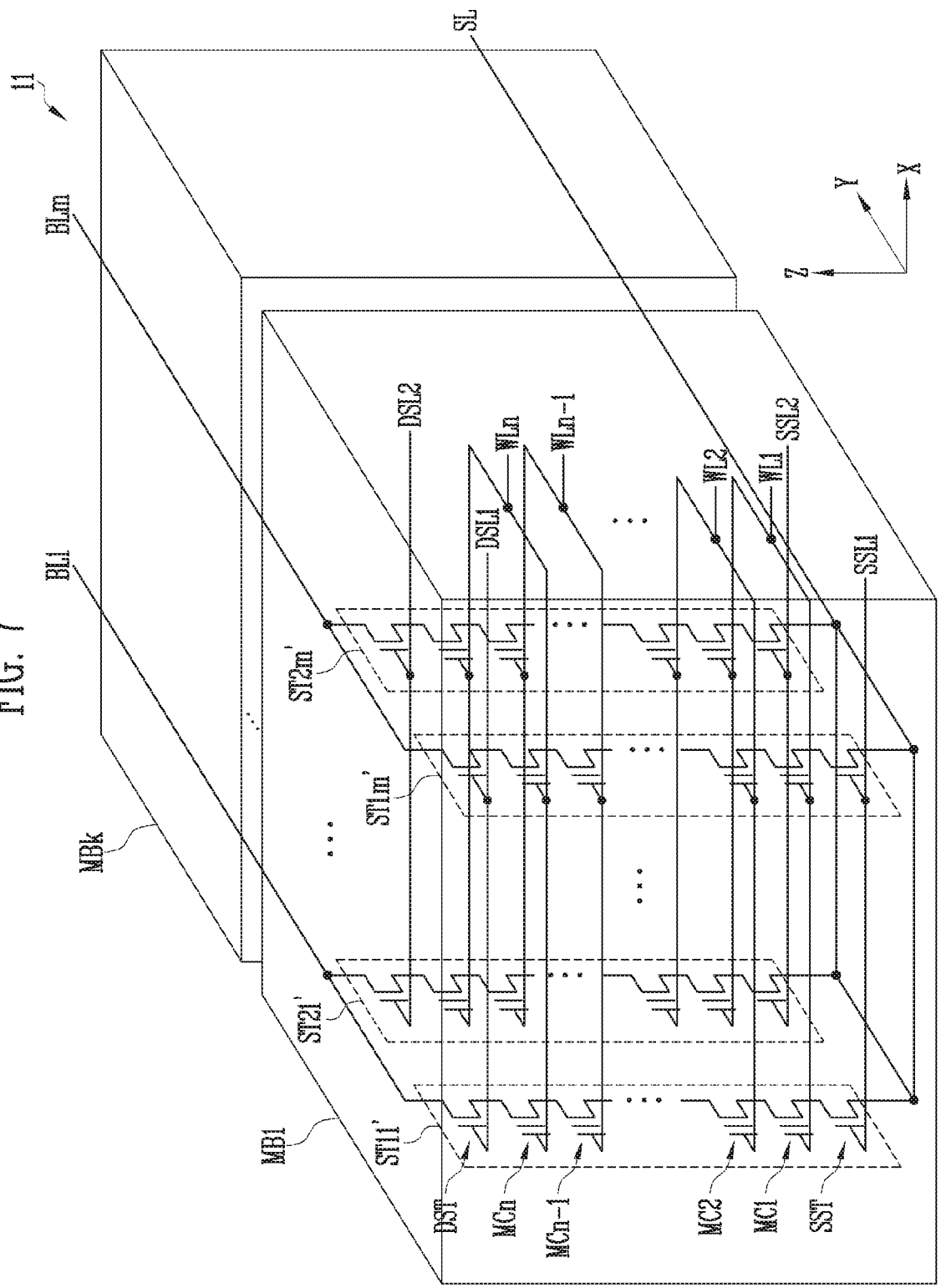
FIG. 7 is a diagram illustrating a memory block having a three-dimensional structure in accordance with an embodiment of the present disclosure.

FIG. 7 is a diagram illustrating an example of a memory block having a three-dimensional structure in accordance with an embodiment of the present disclosure.

Referring to FIG. 7, the memory cell array 10 may include a plurality of memory blocks MB1 to MBk (11). Each memory block 11 may include a plurality of strings ST11' to ST1m' and ST21' to ST2m'. Each of the strings ST11' to ST1m' and ST21' to ST2m' may extend in a vertical direction (i.e., in a Z direction). In each memory block 11, m strings may be arranged in a row direction (i.e., in an X direction). FIG. 7 illustrates that two strings are arranged in a column direction (i.e., in a Y direction), but this is only for the sake of description. For example, three or more strings may be arranged in the column direction (the Y direction).

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to a single source select line.

The first to n-th memory cells MC1 to MCn in each string may be coupled in series between the source select transistor SST and the drain select transistor DST. Gates of the first to n-th memory cells MC1 to MCn may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or the current of the corresponding string may be stably controlled. Thereby, the reliability of data stored in each memory block 11 may be improved.

The drain select transistor DST of each string may be coupled between the corresponding bit line and the memory cells MC1 to MCn. Drain select transistors DST of strings arranged in the row direction may be coupled to corresponding drain select lines extending in the row direction. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

Figure 8:
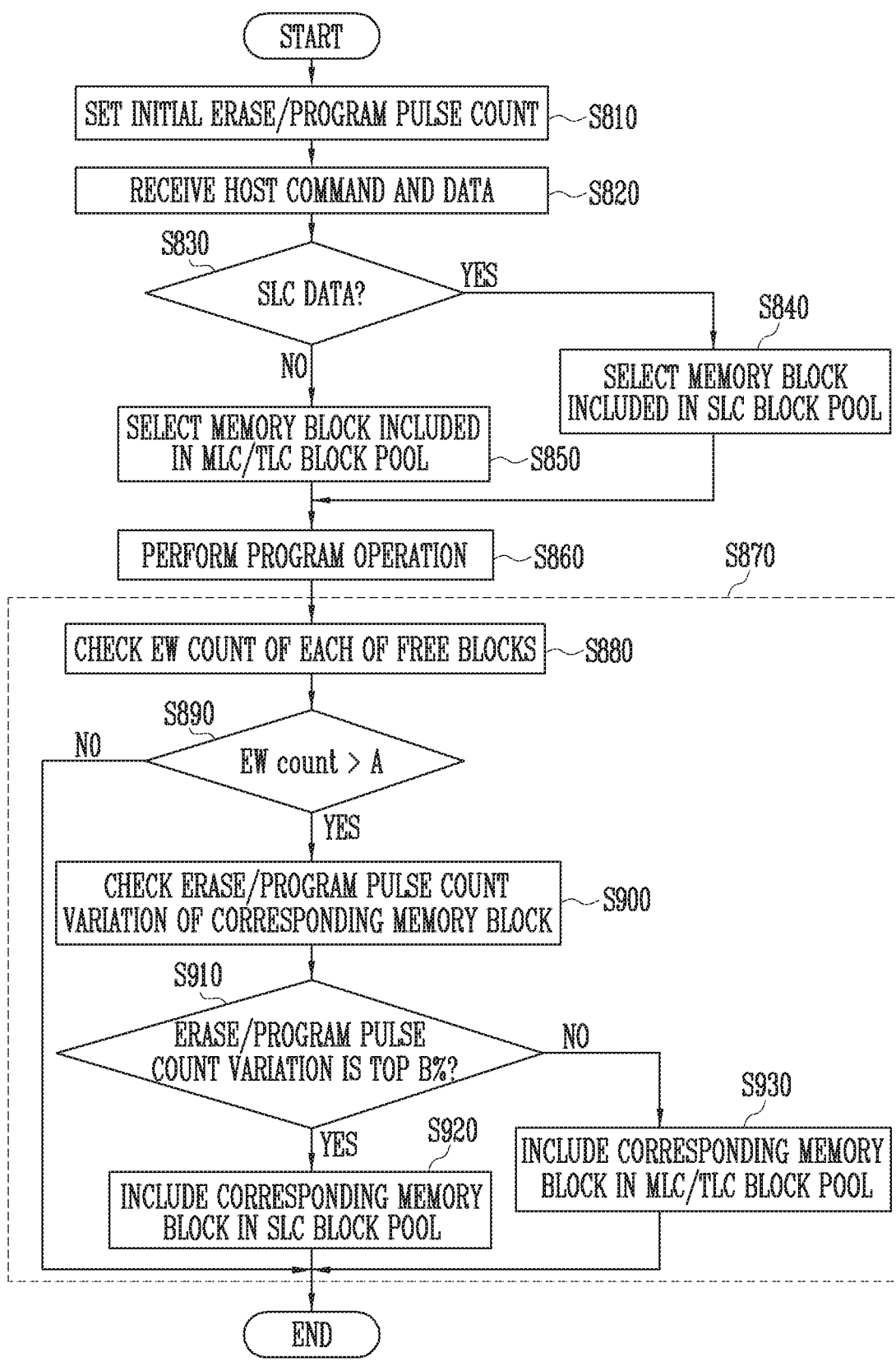
FIG. 8 is a flowchart of an operation of a memory system in accordance with an embodiment of the present disclosure.

FIG. 8 is a flowchart of an operation of a memory system in accordance with an embodiment of the present disclosure. The memory system may be the memory system 1000 of FIG. 1.

A method of operating the memory system 1000 in accordance with an embodiment of the present disclosure will be described with reference to FIGS. 1 to 8.

The wear level management block 1240 sets an initial erase/program pulse count of each of the memory blocks 11 included in the memory device 1100 in an initial status of the memory system 1000, i.e., immediately after completion of fabrication of the memory system 1000, at step S810.

For example, the initial pulse count management block 1241 of the wear level management block 1240 may check the initial erase/program pulse count of each of the plurality of memory blocks 11, and set the initial erase/program pulse count for each of the plurality of memory blocks 11 based on a result of the checking. The initial pulse count management block 1241 may control the memory device 1100 to perform a test program operation on each of the plurality of memory blocks 11 in the initial status. Each of the plurality of memory blocks 11 may perform a test program operation, and the test program operation may be performed in the SLC program mode. The initial pulse count management block 1241 checks the number of program pulses used in the test program operation of each memory block 11, and sets and stores the checked number as an initial program pulse count for each memory block 11. Here, the test program operation may preferably correspond to an SLC program mode.

The initial pulse count management block 1241 may control the memory device 1100 to perform a test erase operation on each of the plurality of memory blocks 11 after the test program operation has been performed. Each of the plurality of memory blocks 11 may perform a test erase operation. The initial pulse count management block 1241 may check the number of erase pulses used during the test erase operation, and set and store an initial erase pulse count for each memory block 11.

If, at step S820, a host command and data that correspond to a write operation are received from the host 1400, the processor 1220 generates a command queue by queuing the host command and stores the received data in the write buffer 1231 of the memory buffer 1230.

The processor 1220 determines whether the received data is normal data or SLC data by parsing the host command, at step S830. The SLC data may be important data such as system data, and the normal data may be user data.

If a result of determining the data by the processor 1220 indicates that the received data is SLC data (YES), the flash control circuit 1260 selects one of the memory blocks that belong to the SLC block pool 1243 of the memory block mode management block 1245, at step S840.

If the result of determining the data by the processor 1220 indicates that the received data is normal data (NO), the flash control circuit 1260 selects one of the memory blocks that belong to the MLC/TLC block pool 1244 of the memory block mode management block 1245, at step S850.

The flash control circuit 1260 may generate and output an internal command for controlling a program operation on the selected memory block of the memory device 1100 in response to a command queue generated from the processor 1220. Furthermore, the flash control circuit 1260 may control an operation of transmitting and programming data buffered in the write buffer 1231 of the memory buffer 1230 to the memory device 1100. The memory device 1100 performs a program operation corresponding to the SLC program mode or the MLC/TLC program mode on the selected memory block using the internal command received from the flash control circuit 1260 and the data received from the write buffer 1231, at step S860.

The wear level management block 124 performs a wear level check operation on each of free blocks of the memory device 1100, at step S870. The wear level check operation may be performed after an overall operation of the memory device 1100 has been completed, or may be periodically performed at a predetermined interval after the initial wear level check operation has been performed. The wear level check operation may include step S880 to S930.

The pulse count variation management block 1242 checks an EW cycling count (EW count) of each of the memory blocks having a free block status among the memory blocks 11 included in the memory device 1100, at step S880.

Thereafter, the EW cycling count (EW count) of each of the memory blocks is compared with a preset count A, at step S890.

If a result of the comparison indicates that the EW cycling count (EW count) is equal to or less than the preset count A, i.e., not greater than the preset count A (NO), the wear level check operation is completed.

If the result of the comparison indicates that EW cycling count (EW count) is greater than the preset count A (YES), the erase/program pulse count variation of the corresponding memory block is calculated, at step S900. In other words, the current erase/program pulse of the corresponding memory block is checked, and the initial erase/program pulse count and the current erase/program pulse count are compared with each other so that an erase/program pulse count variation is calculated.

For example, the pulse count variation management block 1242 may control the memory device to perform a test program operation and a test erase operation on the corresponding memory block, thus checking a current erase/program pulse count on the corresponding memory block. The test program operation may be performed in an SLC program mode. The pulse count variation management block 1242 may calculate an erase/program pulse count variation of the corresponding memory block by comparing the checked current erase/program pulse count with the initial erase/program pulse count stored in the initial pulse count management block 1241.

The above-mentioned erase/program pulse count variation calculation step S900 may be performed on memory blocks each having an EW cycling count (EW count) greater than the preset count A.

Thereafter, it is checked whether the erase/program pulse count variation of the corresponding memory block falls within a top setting range (e.g., top B %), at step S910. For example, the memory block mode management block 1245 detects free blocks each having an erase/program pulse count variation falling within the top setting range (top B %), based on erase/program pulse count variations of the free blocks calculated by the pulse count variation management block 1242.

If the erase/program pulse count variation of the corresponding memory block falls within the top setting range (top B %) (YES), the memory block mode management block 1245 controls the corresponding memory block such that the memory block belongs to the SLC block pool 1243, at step S920. Memory blocks belonging to the SLC block pool 1243 may be selected during an SLC data write operation of the memory system.

If the erase/program pulse count variation of the corresponding memory block falls out of the top setting range (top B %) (NO), the memory block mode management block 1245 controls the corresponding memory block such that the memory block belongs to the MLC/TLC block pool 1244, at step S930. Memory blocks belonging to the MLC/TLC block pool 1244 may be selected during a normal data write operation of the memory system.

After step S920 or S930 described above has been performed, if a host command corresponding to a new write operation is received from the host 1400, steps S830 to S930 described above may be performed.

In various embodiments of the present disclosure, an erase/program pulse count variation of each of the memory blocks having a free block status, i.e., having an EW cycling count equal to or greater than a preset count, may be checked so that a wear level of each memory block may be checked. Based on a result of the checking, a memory block having a high wear level belongs to an SLC block pool configured to include memory blocks to be programmed in an SLC program mode. Thereby, the data accuracy of a memory block having a high wear level may be improved.

Figure 9:
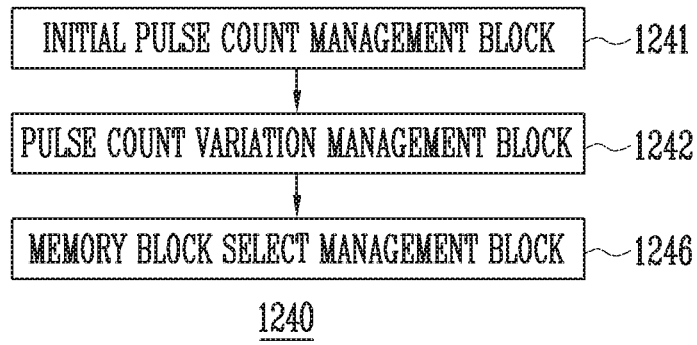
FIG. 9 is a block diagram describing a wear level management block in accordance with an embodiment of the present disclosure.

FIG. 9 is a block diagram describing the wear level management block in accordance with an embodiment of the present disclosure.

Referring to FIG. 9, the wear level management block 1240 may include an initial pulse count management block 1241, a pulse count variation management block 1242, and a memory block select management block 1246.

The initial pulse count management block 1241 may check and store an initial erase/program pulse count of each of the plurality of memory blocks included in the memory device (1100 of FIG. 1). For example, the initial pulse count management block 1241 may control a memory device to perform a test program operation in an SLC program mode on each the plurality of memory blocks included in the memory device 1100 in an initial status immediately after completion of fabrication of the memory system 1000, and may check the number of program pulses used during a test program operation of each memory block, and store the checked number as an initial program pulse count for each memory block. The initial pulse count management block 1241 may control the memory device to perform a test erase operation on each of the plurality of memory blocks after the test program operation, and may check the number of erase pulses used during the test erase operation of each memory block and store the checked number as an initial erase pulse count for each memory block.

Furthermore, the initial pulse count management block 1241 may count and store an erase write (EW) cycling count of each of the plurality of memory blocks included in the memory device 1100.

The pulse count variation management block 1242 checks a wear level of each memory block based on an EW cycling count during a wear level check operation. For example, it is determined that, as the EW cycling count is increased, the wear level is also increased.

Furthermore, the pulse count variation management block 1242 calculates an erase/program pulse count variation by comparing the initial erase/program pulse count stored in the initial pulse count management block 1241 and the current erase/program pulse count, and calculates a final wear level by weighting the wear level of the corresponding memory block based on the erase/program pulse count variation. For example, as the erase/program pulse count variation is increased, the wear level is increased by applying a weighting to the corresponding memory block.

For example, the pulse count variation management block 1242 may control the memory device to perform a test program operation and a test erase operation on memory blocks each having a free block status among the memory blocks, and check a current erase/program pulse count on each of the memory blocks having a free block status. The test program operation may be performed in an SLC program mode. The pulse count variation management block 1242 may calculate an erase/program pulse count variation of each of the memory blocks having a free block status by comparing the checked current erase/program pulse count with the initial erase/program pulse count stored in the initial pulse count management block 1241. Thereafter, the final wear level of the corresponding memory block is calculated, based on the calculated erase/program pulse count variation.

The memory block select management block 1246 selects a memory block to be selected during a subsequent overall operation, based on the final wear levels of the memory blocks that have been calculated by the pulse count variation management block 1242. For example, during a subsequent overall operation, the memory block select management block 1246 selects a memory block having the lowest final wear level among the memory blocks each having a free block status. The flash control circuit 1260 of FIG. 2 selects the memory block selected by the memory block select management block 1246 during a write operation, and performs the write operation on the selected memory block.

Figure 10:
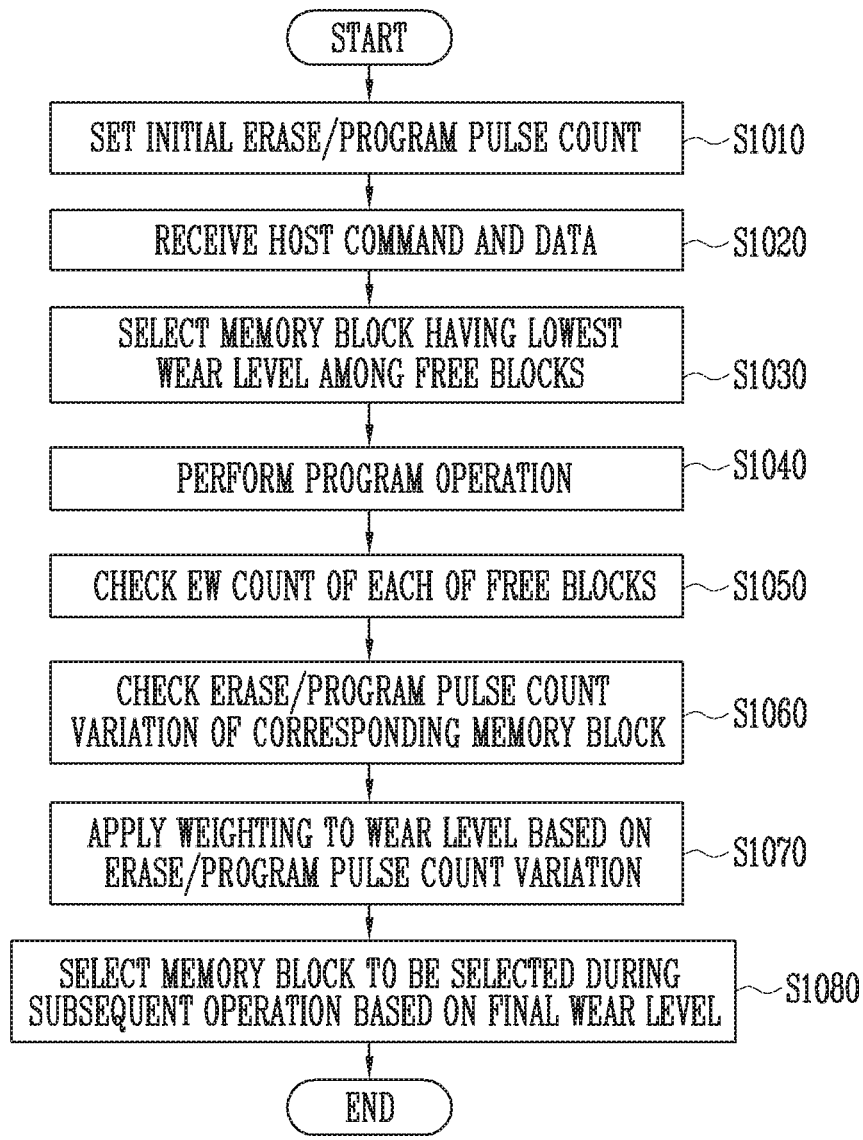
FIG. 10 is a flowchart of an operation of a memory system in accordance with an embodiment of the present disclosure.

FIG. 10 is a flowchart of an operation of the memory system 1000 in accordance with an embodiment of the present disclosure.

A method of operating the memory device in accordance with an embodiment of the present disclosure will be described with reference to FIGS. 1 to 7, 9 and 10.

The wear level management block 1240 sets an initial erase/program pulse count for each of the memory blocks 11 included in the memory device 1100 in an initial status of the memory system 1000, i.e., immediately after completion of fabrication of the memory system 1000, at step S1010.

For example, the initial pulse count management block 1241 of the wear level management block 1240 checks the initial erase/program pulse count of each of the plurality of memory blocks 11, and sets the initial erase/program pulse count for each of the plurality of memory blocks 11 based on a result of the checking. The initial pulse count management block 1241 controls the memory device 1100 to perform a test program operation on each of the plurality of memory blocks 11 in the initial status. Each of the plurality of memory blocks 11 may perform a test program operation, and the test program operation may be performed in the SLC program mode. The initial pulse count management block 1241 checks the number of program pulses used in the test program operation of each memory block 11, and sets and stores the checked number as an initial program pulse count for each memory block 11. Here, the test program operation may preferably correspond to an SLC program mode.

The initial pulse count management block 1241 may control the memory device 1100 to perform a test erase operation on each of the plurality of memory blocks 11 after the test program operation has been performed. Each of the plurality of memory blocks 11 may perform a test erase operation. The initial pulse count management block 1241 may check the number of erase pulses used during the test erase operation, and sets and stores an initial erase pulse count for each memory block 11.

If, at step S1020, a host command and data that correspond to a write operation are received from the host 1400, the processor 1220 generates a command queue by queuing the host command and stores the received data in the write buffer 1231 of the memory buffer 1230.

The flash control circuit 1260 may generate and output an internal command for controlling a program operation on the selected memory block of the memory device 1100 in response to a command queue generated from the processor 1220. Furthermore, the flash control circuit 1260 may control an operation of transmitting and programming data buffered in the write buffer 1231 of the memory buffer 1230 to the memory device 1100. Here, the flash control circuit 1260 controls the memory device 1100 to select the memory block having the lowest wear level selected by the memory block select management block 1246 and perform a program operation on the selected memory block, at step S1030.

The memory device 1100 performs the program operation on the selected memory block using an internal command received from the flash control circuit 1260 and data received from the write buffer 1231, at step S1040.

The wear level management block 1240 checks an EW cycling count of each of the memory blocks having a free block status among the memory blocks 11 included in the memory device 1100, at step S1050.

Thereafter, the erase/program pulse count variation of the corresponding memory block is checked, at step S1060. For example, the pulse count variation management block 1242 may control the memory device to perform a test program operation and a test erase operation on the corresponding memory block, thus checking a current erase/program pulse count on the corresponding memory block. The test program operation may be performed in an SLC program mode. The pulse count variation management block 1242 may calculate an erase/program pulse count variation of the corresponding memory block by comparing the checked current erase/program pulse count with the initial erase/program pulse count stored in the initial pulse count management block 1241.

Thereafter, the pulse count variation management block 1242 calculates a final wear level by weighting the wear level of the corresponding memory block based on the erase/program pulse count variation, at step S1070. For example, the pulse count variation management block 1242 may calculate the final wear level by increasing the wear level of the corresponding memory block in such a way that as the erase/program pulse count variation is increased, the wear level of the corresponding memory block is weighted.

The memory block select management block 1246 selects a memory block to be selected during a subsequent overall operation, based on the final wear levels of the memory blocks that have been calculated by the pulse count variation management block 1242, at step S1080. For example, the memory block select management block 1246 selects, during a subsequent write operation, a memory block having the lowest wear level among the memory blocks each having a free block status.

After step S1080, if a host command corresponding to the write operation is received, the process may be re-performed from step S1030.

As described above, in according to this embodiment, a wear level of a corresponding memory block may be calculated based on an EW cycling count of the memory block, and a final wear level of the memory block may be calculated by weighting the wear level of the memory block depending on an erase/program pulse count variation of the memory block. Since a memory block to be selected during a subsequent write operation based on the final wear level is selected, the memory blocks may be uniformly used based on the wear levels of the memory blocks. Consequently, the lifetime of the memory blocks may be improved.

Figure 11:
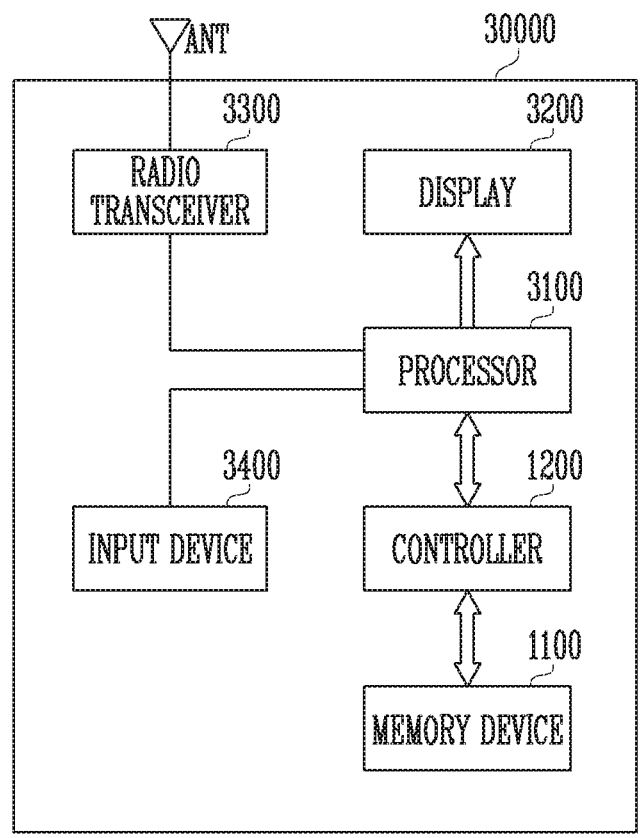
FIG. 11 is a simplified block diagram illustrating a memory system in accordance with an embodiment of the present disclosure.

FIG. 11 is a diagram illustrating a memory system 30000 in accordance with an embodiment of the present disclosure.

Referring to FIG. 11, the memory system 30000 may be embodied in a cellular phone, a smartphone, a tablet PC, a personal digital assistant (PDA) or a wireless communication device. The memory system 30000 may include a memory device 1100, and a controller 1200 capable of controlling the operation of the memory device 1100. The controller 1200 may control a data access operation, e.g., a program operation, an erase operation, or a read operation, of the memory device 1100 under control of a processor 3100.

Data programmed to the memory device 1100 may be output through a display 3200 under control of the controller 1200.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal output from the radio transceiver 3300 and transmit the processed signal to the controller 1200 or the display 3200. The controller 1200 may program a signal processed by the processor 3100 to the memory device 1100. Furthermore, the radio transceiver 3300 may change a signal output from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad, a computer mouse, a keypad or a keyboard. The processor 3100 may control the operation of the display 3200 such that data output from the memory controller 1200, data output from the radio transceiver 3300, or data output form the input device 3400 is output through the display 3200.

In an embodiment, the controller 1200 capable of controlling the operation of the memory device 1100 may be embodied as a part of the processor 3100 or a chip provided separately from the processor 3100. Alternatively, the controller 1200 may be embodied by an example of the controller shown in FIG. 2.

Figure 12:
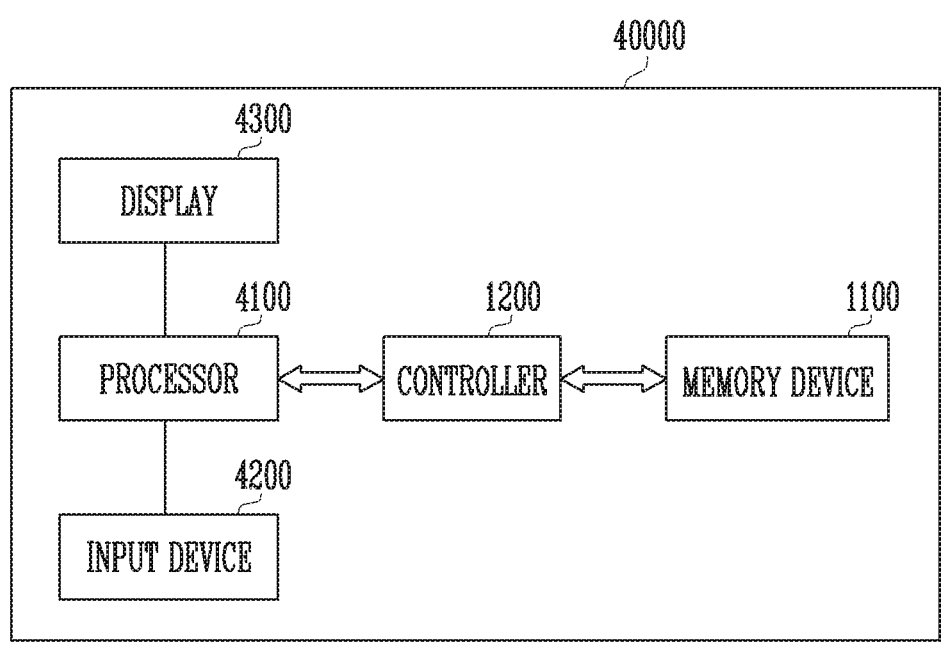
FIG. 12 is a simplified block diagram illustrating a memory system in accordance with an embodiment of the present disclosure.

FIG. 12 is a diagram illustrating a memory system 40000 in accordance with an embodiment of the present disclosure.

Referring to FIG. 12, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 1100, and a controller 1200 capable of controlling a data processing operation of the memory device 1100.

A processor 4100 may output data stored in the memory device 1100 through a display 4300, according to data input from an input device 4200. For example, the input device 4200 may be embodied in a pointing device such as a touch pad, a computer mouse, a keypad, or a keyboard.

The processor 4100 may control the overall operation of the memory system 40000 and control the operation of the controller 1200. In an embodiment, the controller 1200 capable of controlling the operation of the memory device 1100 may be embodied as a part of the processor 4100 or a chip provided separately from the processor 4100. Alternatively, the controller 1200 may be embodied by an example of the controller shown in FIG. 2.

Figure 13:
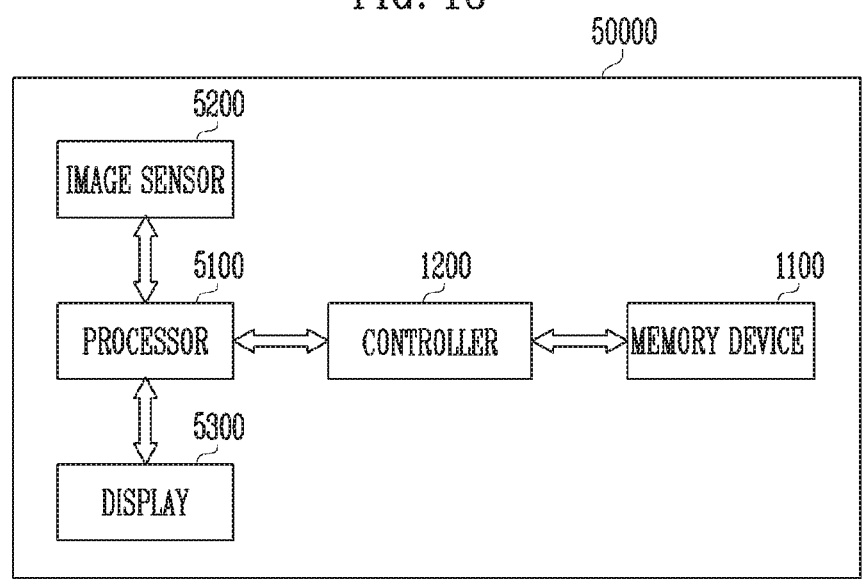
FIG. 13 is a simplified block diagram illustrating a memory system in accordance with an embodiment of the present disclosure.

FIG. 13 is a diagram illustrating a memory system 50000 in accordance with an embodiment of the present disclosure.

Referring to FIG. 13, the memory system 50000 may be embodied in an image processing device, e.g., a digital camera, a portable phone provided with a digital camera, a smartphone provided with a digital camera, or a tablet PC provided with a digital camera.

The memory system 50000 may include a memory device 1100, and a controller 1200 capable of controlling a data processing operation, e.g., a program operation, an erase operation, or a read operation, of the memory device 1100.

An image sensor 5200 of the memory system 50000 may convert an optical image into digital signals. The converted digital signals may be transmitted to a processor 5100 or the controller 1200. Under control of the processor 5100, the converted digital signals may be output through a display 5300 or stored to the memory device 1100 through the controller 1200. Data stored in the memory device 1100 may be output through the display 5300 under control of the processor 5100 or the controller 1200.

In an embodiment, the controller 1200 capable of controlling the operation of the memory device 1100 may be embodied as a part of the processor 5100 or a chip provided separately from the processor 5100. Alternatively, the controller 1200 may be embodied by an example of the controller shown in FIG. 2.

Figure 14:
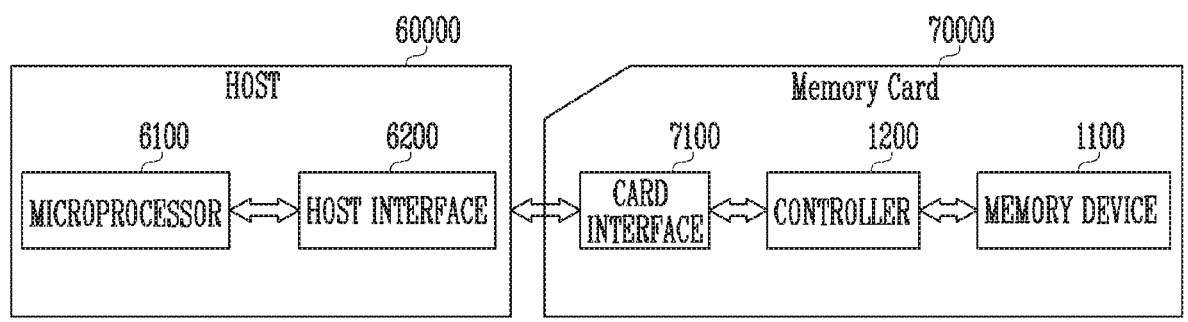
FIG. 14 is a simplified block diagram illustrating a memory system in accordance with an embodiment of the present disclosure.

FIG. 14 is a diagram illustrating a memory system 70000 in accordance with an embodiment of the present disclosure.

Referring to FIG. 14, the memory system 70000 may be embodied in a memory card or a smart card. The memory system 70000 may include a memory device 1100, a controller 1200, and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto. The controller 1200 may be embodied by an example of the controller 1200 shown in FIG. 2.

The card interface 7100 may interface data exchange between a host 60000 and the controller 1200 according to a protocol of the host 60000. In an embodiment, the card interface 7100 may support a universal serial bus (USB) protocol, and an interchip (IC)-USB protocol. Here, the card interface may refer to hardware capable of supporting a protocol which is used by the host 60000, software installed in the hardware, or a signal transmission scheme.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the controller 1200 under control of a microprocessor 6100.

In various embodiments of the present disclosure, since memory blocks are managed in such a way that a wear level of each memory block is determined based on a variation in an erase/program pulse count value of the memory block, the wear levels of the memory blocks may be more accurately determined, whereby the efficiency of a memory system may be improved.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not be always performed in regular order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A controller configured to control a memory device including a plurality of memory blocks, the controller comprising:
   a memory block management block configured to obtain a first list of memory blocks selected by a preset number in order of a largest erase/program pulse count variation from among an erase/program pulse count variation of each of the plurality of memory blocks and a second list of remaining memory blocks from among the plurality of memory blocks; and
   a processor configured to:
   control the memory device to perform a Single-Level-Cell (SLC) program operation on a memory block selected from among the memory blocks included in the first list, and
   control the memory device to perform a Multi-Level-Cell (MLC) program operation or a Triple-Level-Cell (TLC) program operation on a memory block selected from among the memory blocks included in the second list.

2. The controller according to claim 1, further comprising:
   a pulse count variation management block configured to calculate the erase/program pulse count variation of the each of the plurality of memory blocks indicating a difference between a current erase/program pulse count and an initial erase/program pulse count of the each of the plurality of memory blocks.

3. The controller according to claim 2, further comprising:
   an initial pulse count management block configured to store a count of pulses used in a test program operation or a test erase operation performed on the each of the plurality of memory blocks, as the initial erase/program pulse count of the each of the plurality of memory blocks,
   wherein the pulse count variation management block obtains a count of pulses used in the test program operation or the test erase operation most recently performed on the each of the plurality of memory blocks as the current erase/program pulse count of the each of the plurality of memory blocks.

4. The controller according to claim 1, wherein the processor is further configured to:
   in response to system data being received from a host, select a memory block from among the memory blocks included in the first list, and
   in response to user data being received from the host, select a memory block from among the memory blocks included in the second list.

5. The controller according to claim 1, further comprising:
   a pulse count variation management block configured to calculate a wear level of the each of the plurality of memory blocks in proportion to the erase/program pulse count variation of the each of the plurality of memory blocks; and a memory block select management block configured to determine a memory block having a minimum wear level from among the memory blocks included in the first list or the second list as the memory block selected from among the memory blocks included in the first list or the second list.

6. A memory system comprising:
a memory device including a plurality of memory blocks; and
a controller configured to:
obtain a first block pool including memory blocks each having an erase/program pulse count variation within a top setting range from among an erase/program pulse count variation of each of the plurality of memory blocks and a second block pool including remaining memory blocks among the plurality of memory blocks,
control the memory device to perform a Single-Level-Cell (SLC) program operation on a memory block selected from among the memory blocks included in the first block pool, and
control the memory device to perform a Multi-Level-Cell (MLC) program operation or a Triple-Level-Cell (TLC) program operation on a memory block selected from among the memory blocks included in the second block pool.

7. The memory system according to claim 6, wherein the controller comprises
a processor configured to, in response to a write command and data being received from a host, generate a command queue and determine whether the data is an enhanced data type or a normal data type.

8. The memory system according to claim 6, wherein the controller comprises a pulse count variation management block configured to calculate the erase/program pulse count variation of the each of the plurality of memory blocks indicating a difference between a current erase/program pulse count and an initial erase/program pulse count of the each of the plurality of memory blocks.

9. The memory system according to claim 8, wherein the controller comprises an initial pulse count management block configured to store a count of pulses used in a test program operation or a test erase operation performed on the each of the plurality of memory blocks, as the initial erase/program pulse count of the each of the plurality of memory blocks, and
wherein the a pulse count variation management block obtains a count of pulses used in the test program operation or the test erase operation most recently performed on the each of the plurality of memory blocks as the current erase/program pulse count of the each of the plurality of memory blocks.

10. The memory system according to claim 6, wherein the controller comprises a processor configured to:
in response to system data being received from a host, select a memory block from among the memory blocks included in the first block pool, and in response to user data being received from the host, select a memory block from among the memory blocks included in the second block pool.

11. The memory system according to claim 6, wherein the controller comprises:
a pulse count variation management block configured to calculate a wear level of the each of the plurality of memory blocks in proportion to the erase/program pulse count variation of the each of the plurality of memory blocks; and
a memory block select management block configured to determine a memory block having a minimum wear level from among the memory blocks included in the first block pool or the second block pool as the memory block selected from among the memory blocks included in the first block pool or the second block pool.

12. A controller configured to control a memory device including memory blocks, the controller comprising:
a wear level management block configured to obtain a wear level of each of the memory blocks based on an erase write (EW) cycling count of the each of the memory blocks, and obtain a final wear level of the each of the memory blocks by weighting the wear level and an erase/program pulse count variation of the each of the memory blocks; and
a processor configured to, in response to a write command received from a host, control the memory device to perform a program operation on a memory block having a minimum final wear level from among the final wear level of the each of the memory blocks,
wherein the erase/program pulse count variation indicates a difference between a first count of pulses used in a test erase/program operation previously performed on the each of the memory blocks and a second count of pulses used in the test erase/program operation recently performed on the each of the memory blocks.

13. The controller according to claim 12, wherein the wear level management block calculates a weight of the wear level of the each of the memory blocks by comparing the first count and the second count.

14. The controller according to claim 12, wherein the wear level management block controls the memory device to perform the test erase/program operation on the each of the memory blocks in an initial status, and obtains the first count of pulses used in the test erase/program operation.

15. The controller according to claim 12, wherein the wear level management block controls the memory device to perform the test erase/program operation on the each of the memory blocks during a wear level check operation, and obtains the second count of pulses used in the test erase/program operation.

16. The controller according to claim 14, wherein the wear level management block comprises
an initial pulse count management block configured to store the first count.

* * * * *